US012575182B2

(12) United States Patent
Jung et al.

(10) Patent No.: US 12,575,182 B2
(45) Date of Patent: Mar. 10, 2026

(54) DISPLAY APPARATUS AND LIGHT-EMITTING DIODE MODULE

(71) Applicant: SAMSUNG ELECTRONICS CO., LTD., Suwon-si (KR)

(72) Inventors: Youngki Jung, Suwon-si (KR); Sangmin Shin, Suwon-si (KR); Kisun Kang, Suwon-si (KR); Donghwan Kim, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/084,118

(22) Filed: Dec. 19, 2022

(65) Prior Publication Data

US 2023/0122312 A1    Apr. 20, 2023

Related U.S. Application Data

(63) Continuation of application No. PCT/KR2021/095056, filed on May 26, 2021.

(30) Foreign Application Priority Data

Jul. 17, 2020    (KR) ........................ 10-2020-0088795

(51) Int. Cl.
H10D 86/60        (2025.01)
G09G 3/32         (2016.01)
(Continued)

(52) U.S. Cl.
CPC ............... H10D 86/60 (2025.01); G09G 3/32 (2013.01); H01L 25/167 (2013.01);
(Continued)

(58) Field of Classification Search
CPC .... G09G 3/32; G09G 2300/0426; G09F 9/33; H01L 27/15; H01L 21/28; H01L 27/124;
(Continued)

(56) References Cited

U.S. PATENT DOCUMENTS 10,468,391 B2    11/2019  Cok
11,204,663 B2 *  12/2021  Lee ........................ H10K 59/18
(Continued)

FOREIGN PATENT DOCUMENTS

EP      3 493 194 A1     6/2019
KR      10-0679410 B1    2/2007
(Continued)

OTHER PUBLICATIONS

International Search Report dated Sep. 8, 2021 issued by the International Searching Authority in International Application No. PCT/KR2021/095056 (PCT/ISA/210).
(Continued)

*Primary Examiner* — Doon Y Chow
(74) *Attorney, Agent, or Firm* — Sughrue Mion, PLLC

(57)                    ABSTRACT

A light-emitting diode (LED) module includes: a glass substrate; a signal wiring layer provided on the glass substrate and including a plurality of electrodes connected by a passive matrix circuit; and a plurality of LEDs connected to the plurality of electrodes and configured to emit light toward the glass substrate, wherein the signal wiring layer further includes a boundary region that divides the LED module into a plurality of unit regions.

11 Claims, 10 Drawing Sheets

(51) Int. Cl.
H01L 23/00 (2006.01)
H01L 25/16 (2023.01)
H10D 86/40 (2025.01)

(52) U.S. Cl.
CPC ... H10D 86/441 (2025.01); G09G 2300/0426
(2013.01); H01L 24/05 (2013.01); H01L 24/32
(2013.01); H01L 24/83 (2013.01); **H01L
2224/05572 (2013.01); H01L 2224/05573**
(2013.01); H01L 2224/05688 (2013.01); **H01L
2224/32225 (2013.01); H01L 2224/83851**
(2013.01)

(58) Field of Classification Search
CPC ... H01L 25/0753; H01L 33/02; H01L 21/768;
H01L 33/62; H01L 2224/05573; H01L
2224/05572; H01L 24/32; H01L 24/83;
H01L 2224/05688; H01L 2224/83851;
H01L 24/05; H01L 2224/32225
See application file for complete search history.

(56) References Cited

U.S. PATENT DOCUMENTS

| | | | |
|---|---|---|---|
| 11,437,356 | B2 * | 9/2022 | Lee ........................ H01L 25/167 |
| 11,742,358 | B2 | 8/2023 | Jang et al. |
| 2007/0153515 | A1 | 7/2007 | Hong et al. |
| 2007/0229446 | A1 | 10/2007 | Oh et al. |
| 2015/0332635 | A1 | 11/2015 | Lau et al. |
| 2017/0200775 | A1 | 7/2017 | Kim |
| 2018/0269328 | A1 | 9/2018 | Park |
| 2019/0198582 | A1 | 6/2019 | Yeo |
| 2019/0347985 | A1 | 11/2019 | Shaeffer et al. |
| 2020/0161405 | A1 * | 5/2020 | Kim ......................... G09G 3/32 |
| 2020/0161408 | A1 * | 5/2020 | Lee ........................ H01L 22/32 |

| | | | |
|---|---|---|---|
| 2020/0342825 | A1 | 10/2020 | Kurokawa |
| 2020/0350464 | A1 | 11/2020 | Shin et al. |
| 2021/0005796 | A1 * | 1/2021 | Min .................... H01L 33/0093 |
| 2022/0069061 | A1 | 3/2022 | Kim et al. |
| 2022/0137462 | A1 | 5/2022 | Kimura |

FOREIGN PATENT DOCUMENTS

| | | |
|---|---|---|
| KR | 10-1237788 B1 | 2/2013 |
| KR | 10-1248900 B1 | 4/2013 |
| KR | 10-2014-0080240 A | 6/2014 |
| KR | 10-2017-0026954 A | 3/2017 |
| KR | 10-2017-0084413 A | 7/2017 |
| KR | 10-2019-0053500 A | 5/2019 |
| KR | 10-2019-0062631 A | 6/2019 |
| KR | 10-2019-0072196 A | 6/2019 |
| KR | 10-2019-0078746 A | 7/2019 |
| KR | 10-2019-0100414 A | 8/2019 |
| KR | 10-2020-0004751 A | 1/2020 |
| KR | 10-2073572 B1 | 2/2020 |
| KR | 10-2020-0057198 A | 5/2020 |

OTHER PUBLICATIONS

International Written Opinion dated Sep. 8, 2021 issued by the International Searching Authority in International Application No. PCT/KR2021/095056 (PCT/ISA/237).
Communication issued on Oct. 28, 2024 by the Korean Intellectual Property Office in Korean Patent Application No. 10-2020-0088795.
Communication dated May 9, 2025, issued by the Korean Intellectual Property Office in Korean Patent Application No. 10-2020-0088795.
Communication issued on Jan. 19, 2026 by the Korean Ministry of Intellectual Property (MOIP) in Korean Patent Application No. 10-2020-0088795.

\* cited by examiner

<u>1</u>

DISPLAY APPARATUS AND LIGHT-EMITTING DIODE MODULE

CROSS-REFERENCE TO RELATED APPLICATIONS

This application is a by-pass continuation application of International Application No. PCT/KR2021/095056, filed on May 26, 2021, which based on and claims priority to Korean Patent Application No. 10-2020-0088795, filed on Jul. 17, 2020, in the Korean Intellectual Property Office, the disclosures of which are incorporated by reference herein in their entireties.

BACKGROUND

1. Field

The disclosure relates to a display apparatus and a light-emitting diode (LED) module configured to display an image using a light-emitting diode.

2. Description of Related Art

A display apparatus is a device that converts electrical information into visual information and displays the visual information. The display apparatus may include a portable device such as a laptop personal computer (PC), a smart phone, or a tablet PC, as well as a television and a monitor.

The display apparatus may include a non-self-emissive display panel such as a liquid crystal display (LCD), and a self-emissive display panel that generates light corresponding to a data signal.

Particularly, an LED corresponding to an inorganic light-emitting diode has been actively studied for implementing the self-emissive display panel. The LED is a device for converting an electrical signal into the form of light such as infrared rays and visible light, by using the characteristics of compound semiconductors. The LED is used for home appliances, remote controls, electronic sign boards, and a variety of automation devices. In addition, the LED has been widely used for small hand-held electronic devices and large-size display apparatuses.

SUMMARY

Provided are a display apparatus and a light-emitting diode module capable of efficiently outputting a high-quality image by controlling an image output for each region of the light-emitting diode module.

According to an aspect of the disclosure, a light-emitting diode (LED) module includes: a glass substrate; a signal wiring layer provided on the glass substrate and including a plurality of electrodes connected by a passive matrix circuit; and a plurality of LEDs connected to the plurality of electrodes and configured to emit light toward the glass substrate, wherein the signal wiring layer further includes a boundary region that divides the LED module into a plurality of unit regions.

The signal wiring layer corresponding to at least one of the plurality of unit regions may be electrically opened.

The signal wiring layer may have a bridge-type wiring structure that is electrically opened in the boundary region.

The LED module may further include an active area and a non-active area excluding the active area, and the plurality of LEDs may be provided in the active area.

The LED module may further include a test pad provided in the non-active area.

The LED module may further include an insulating layer on the glass substrate; and a film on glass (FOG) electrode corresponding to the plurality of unit regions and provided on the insulating layer.

According to an aspect of the disclosure, a display apparatus includes: a light-emitting diode (LED) module including a plurality of layer structures; at least one processor configured to control the LED module; and a plurality of driver Integrated Circuits (ICs) connected to the at least one processor to transmit a signal to the LED module, wherein the LED module includes: a glass substrate; a signal wiring layer formed on the glass substrate and including a plurality of electrodes connected by a passive matrix circuit; and a plurality of LEDs connected to the plurality of electrodes and configured to emit light toward the glass substrate, and wherein the signal wiring layer includes a boundary region that divides the LED module into a plurality of unit regions.

At least one driver IC of the plurality of driver ICs may be configured to transmit a driving signal to the plurality of unit regions of the LED module.

The signal wiring layer corresponding to at least one of the plurality of unit regions may be electrically opened.

The signal wiring layer may have a bridge-type wiring structure that is electrically opened in the boundary region.

The LED module may include an active area and a non-active area excluding the active area, and the plurality of LEDs may be provided in the active area.

The display apparatus may further include a test pad provided in the non-active area.

The display apparatus may further include: an insulating layer on the glass substrate; and a film on glass (FOG) electrode corresponding to the plurality of unit regions and the FOG electrode being provided on the insulating layer.

At least one of the plurality of the driver ICs may be configured to connect the at least one processor and the FOG electrode.

The at least one may be is further configured to control the LED module corresponding to the plurality of unit regions.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
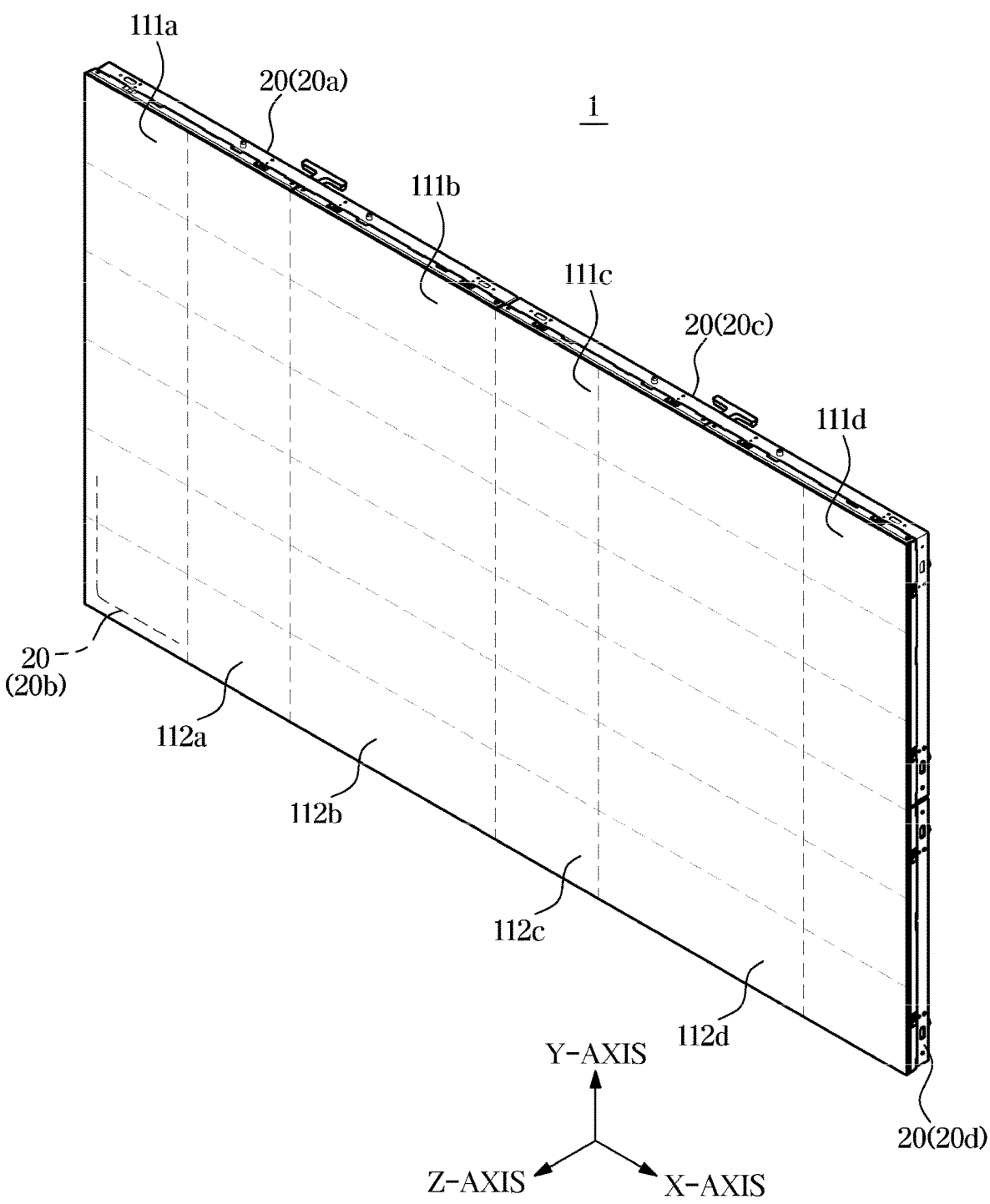
FIG. 1 is a view illustrating an appearance of a display apparatus according to an embodiment of the present disclosure.

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

It will be understood that, although the terms first, second, third, etc., may be used herein to describe various elements, but is should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step or operation, which may be implemented in the order different from the illustrated order unless the context clearly indicates otherwise.

Reference will now be made in detail to embodiments of the disclosure, examples of which are illustrated in the accompanying drawings.

FIG. 1 is a view illustrating an appearance of a display apparatus according to an embodiment of the present disclosure.

In FIG. 1, X-axis, Y-axis, and Z-axis directions perpendicular to each other are illustrated. The X-axis direction represents a left and right direction, the Y-axis direction represents an up and down direction, and the Z-axis direction represents a front and rear direction.

A display apparatus 1 is a device configured to display information, material, and data as characters, figures, graphs, and images. An advertisement board, an electric billboard, a screen, a television, and a monitor may be implemented with the display apparatus 1. The display apparatus 1 may be installed on a wall or a ceiling, or installed on an indoor or outdoor ground by a stand.

The display apparatus 1 may include a light-emitting diode (LED) module 110 configured to display a screen, and a frame 20 coupled to a rear side of the LED module 110 to support the LED module 110.

The LED module may include a plurality of unit regions 111*a* to 111*d* and 112*a* to 112*d*.

The unit regions 111*a* to 111*d* and 112*a* to 112*d* may refer to blocks formed by electrically opening a part of the LED module. A detailed description of the unit region will be described below.

Figure 2:
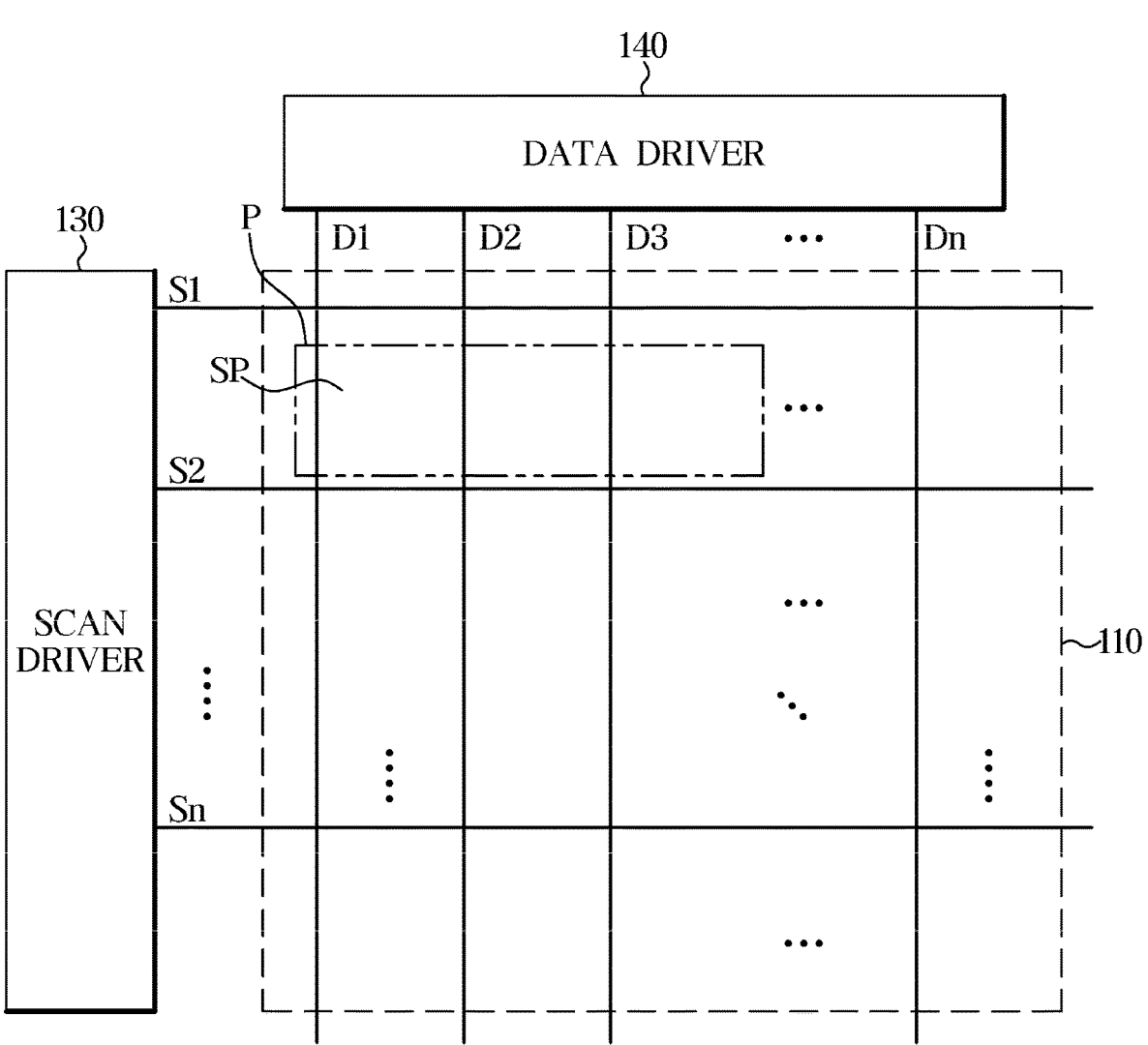
FIG. 2 is a view schematically illustrating a configuration of an LED module according to an embodiment of the present disclosure.

FIG. 2 is a view schematically illustrating a configuration of an LED module according to an embodiment of the present disclosure.

Referring to FIG. 2, a plurality of data lines D1-Dm arranged in a column direction, a plurality of scan lines S1-Sn arranged in a row direction, and a plurality of sub pixel regions (SP) provided adjacent to an intersection between the data line D1-Dm and the scan line S1-Sn may be provided on one surface of the LED module 110. A sub-pixel circuit may be provided in each sub-pixel region SP. Among the plurality of sub-pixel regions (SP), at least three sub-pixel regions (SP) adjacent to each other may form a pixel region P.

The data lines D1-Dm may transmit a data signal representing an image signal to a sub-pixel circuit in the sub-pixel region (SP), and the scan lines S1-Sn may transmit a scan signal to a sub-pixel circuit in the sub-pixel region (SP).

By a scan driver 130, the scan signal may be sequentially applied to each of the plurality of scan lines S1-Sn, and by a data driver 140, a data voltage (VDATA) corresponding to the image signal may be applied to the plurality of data lines D1-Dm.

According to an embodiment of the present disclosure, the scan driver 130 and the data driver 140 may be mounted on an upper side of a substrate 111 of the LED module. Accordingly, a bezel (a width in a direction surrounding the pixel region) of the LED module 110 may be minimized or omitted and thus an entire front surface of the LED module 110 may function as the pixel region.

The data driver 140 and the scan driver 130 shown in FIG. 2 may be provided as a driver Integrated Circuit (IC) (or hereinafter, "a driver"), which will be described later.

The data driver 140 and the scan driver 130 shown in FIG. 2 illustrate a conceptual configuration, and thus it is not required that the data driver 140 and the scan driver 130 are provided at corresponding positions in FIG. 2.

Figure 3:
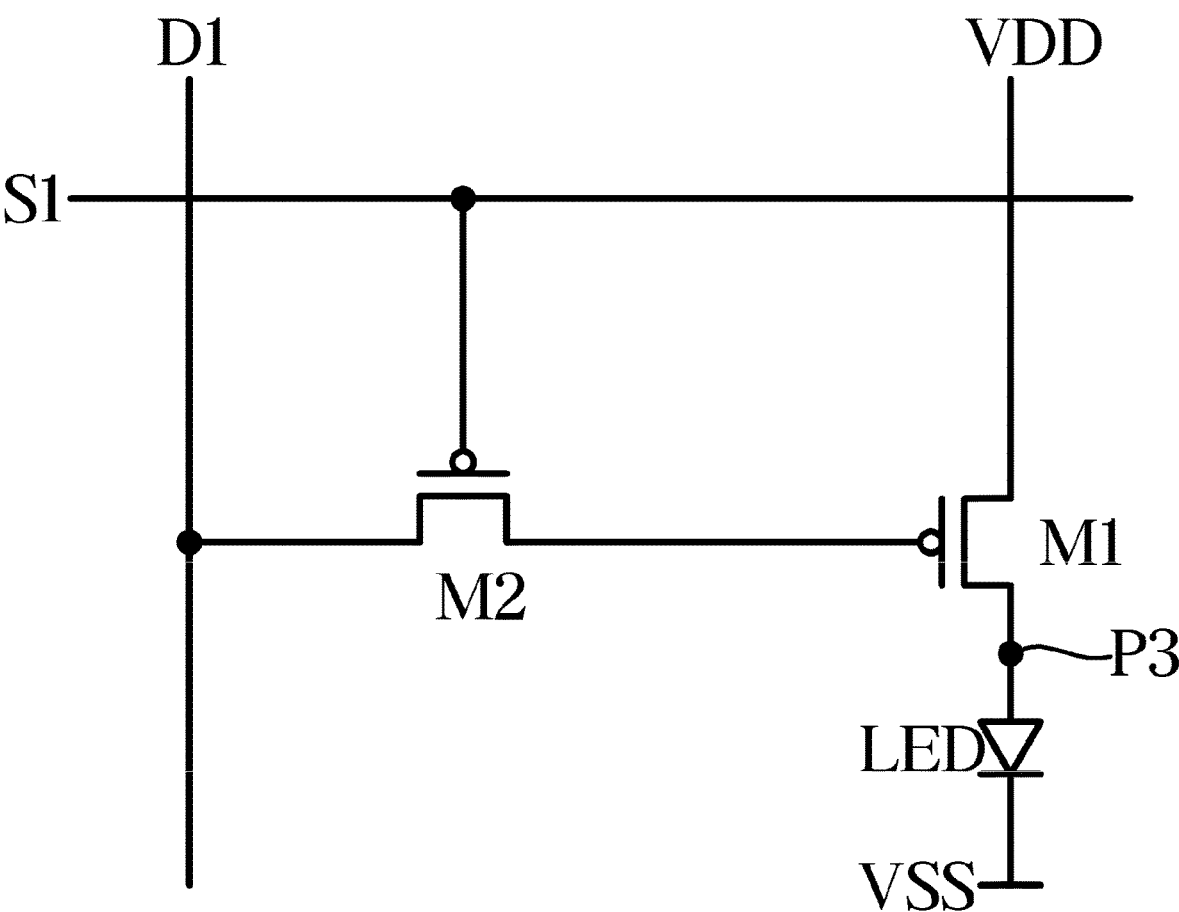
FIG. 3 is a view illustrating a circuit diagram of the LED module of FIG. 2.

FIG. 3 is a view illustrating a circuit diagram of the LED module of FIG. 2.

FIG. 3 is an equivalent circuit diagram illustrating a sub-pixel circuit of the sub-pixel region (SP) of FIG. 2. Particularly, FIG. 3 illustrates a sub-pixel circuit driven by a first scan line S1 and a first data line D1.

Referring to FIG. 3, the pixel circuit may include a LED, and two transistors M1 and M2.

The plurality of transistors M1 and M2 may be provided as P-channel metal-oxide-semiconductor (PMOS) transistors. However, such a circuit configuration is an example of the sub-pixel circuit. Therefore, the sub-pixel circuit is not limited to the circuit configuration of FIG. 3.

As for a switching transistor M2, a gate electrode may be connected to the scan line Sn, a source electrode may be connected to the data line Dm, and a drain electrode may be connected to a gate electrode of a driving transistor M1 and a power voltage VDD. A source electrode of the driving transistor M1 may be connected to the power voltage VDD, the drain electrode may be connected to an anode 310 of the LED, and a cathode 320 of the LED may be connected to a reference voltage VSS. Accordingly, the LED may emit light based on a current applied from the driving transistor M1.

The reference voltage VSS connected to the cathode 320 of the LED may be lower than the power voltage VDD and thus a ground voltage may be used as the reference voltage VSS.

The driving transistor M1 may allow the LED to emit light by applying a current ILED corresponding to a gate-source voltage VGS to the anode 310 of the LED.

In response to a high data voltage VDATA being transmitted to the gate electrode of the driving transistor M1, the gate-source voltage VGS of the driving transistor M1 may be lowered. Accordingly, a small amount of current ILED may be applied to the anode 310 of the LED and thus the LED may emit less light. Therefore, the LED may display a low gradation. On the other hand, in response to a low data voltage VDATA being transmitted to the gate electrode of the driving transistor M1, the gate-source voltage VGS of the driving transistor M1 may be increased. Accordingly, a large amount of current ILED may be applied to the anode 310 of the LED and thus the LED may emit more light. Therefore, the LED may display a high gradation. Thus, a level of data voltage VDATA applied to each sub-pixel circuits may be selected based on an image to be displayed.

In the present description, the LED module may be driven in a passive matrix method.

Figure 4:
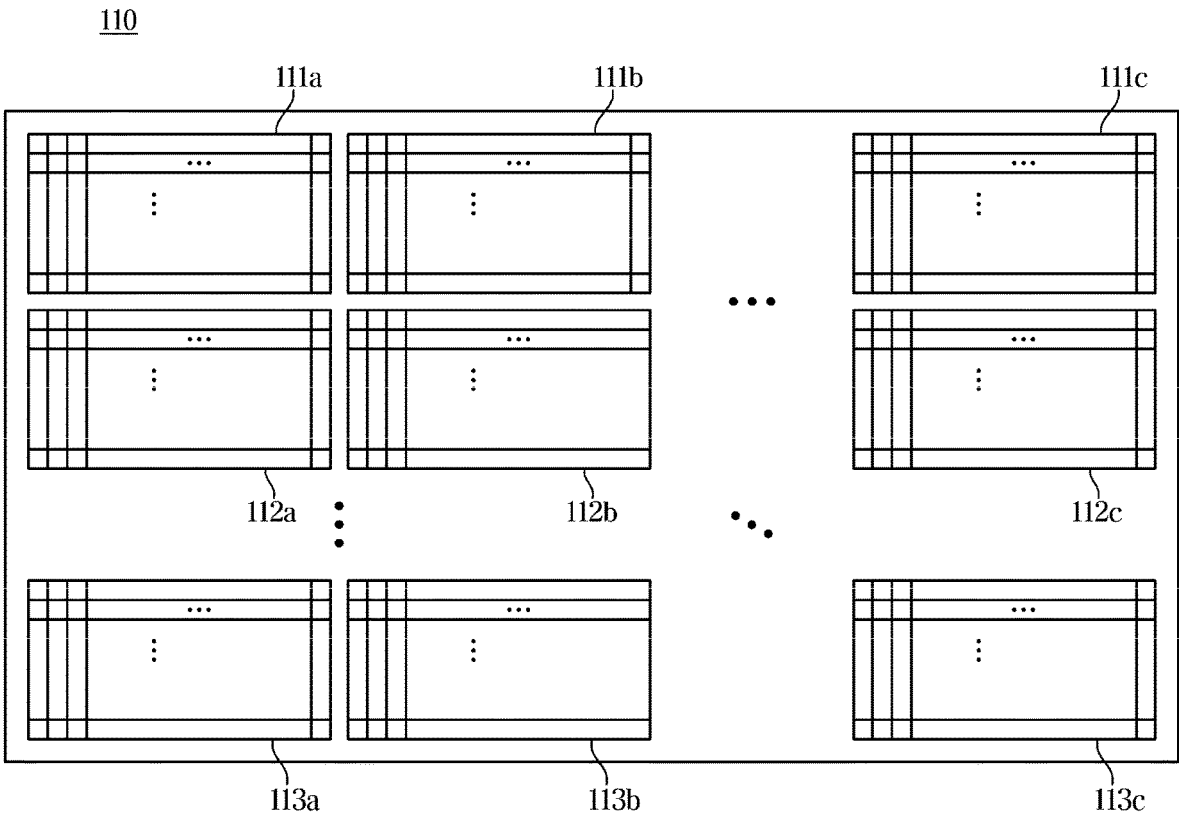
FIG. 4 is a plan view illustrating the LED module according to an embodiment of the present disclosure.

FIG. 4 is a plan view illustrating the LED module according to an embodiment of the present disclosure.

Referring to FIG. 4, the LED module may include a plurality of unit regions.

The plurality of unit regions may be formed to be electrically open, respectively, as will be described later. According to an embodiment, the plurality of unit regions may be provided in a configuration for a large-area, high-resolution micro-LED.

In addition, according to an embodiment, the passive matrix method may be applied to the corresponding unit region.

Further, according to an embodiment, each unit region may be configured to output a predetermined resolution. According to an embodiment, a resolution of each unit region may be provided with a resolution of 240×135 pixels.

FIG. 4 illustrates that the plurality of unit regions is included in the large-area LED module substrate, and the number of unit regions included in each LED module may also be determined according to implementation.

A relation between the LED module and the unit region shown in FIG. 4 is an example of an embodiment and thus the resolution and size of each module and the number of unit regions included in each module may vary.

Figure 5:
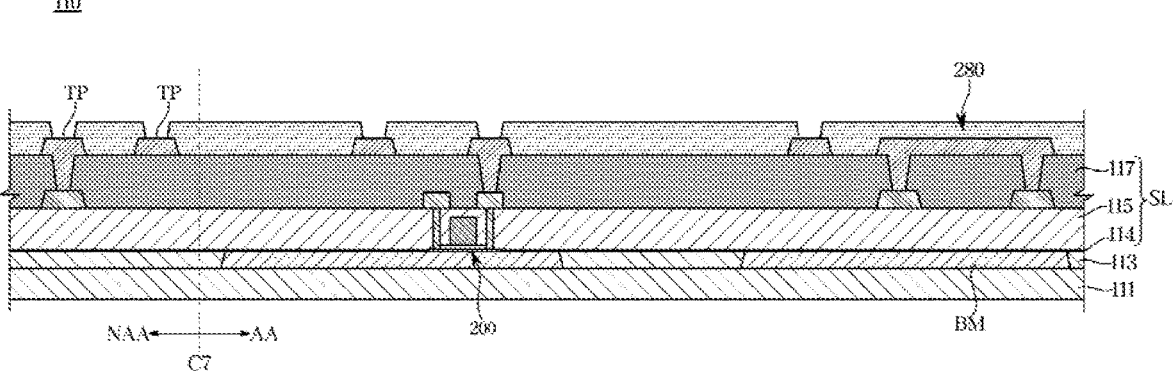
FIGS. 5, 6, and 7 are views illustrating a method of manufacturing the LED module according to an embodiment of the present disclosure.
Figure 6:
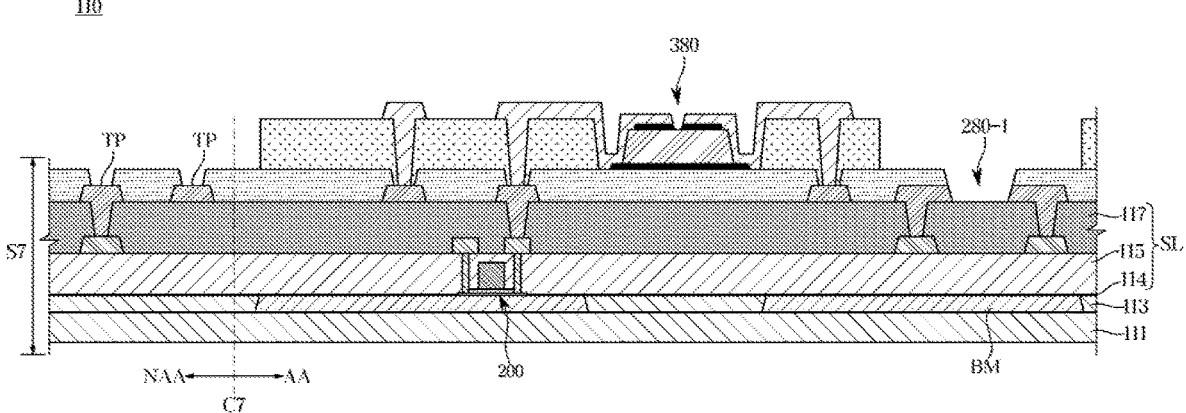
Figure 7:
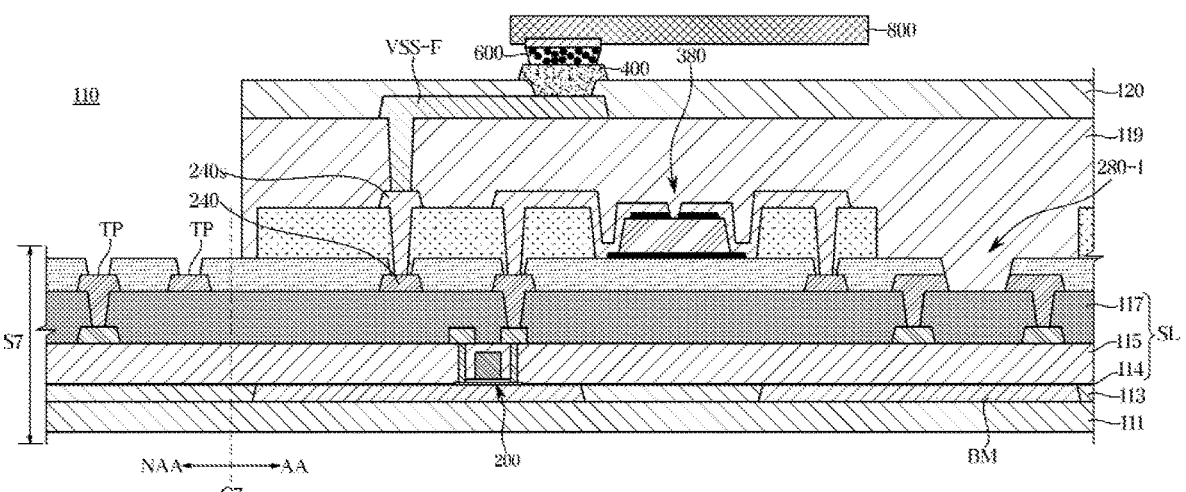

FIGS. 5, 6, and 7 are views illustrating a method of manufacturing the LED module according to an embodiment of the present disclosure.

As shown in FIG. 5, the substrate 111 may be provided, and a light absorbing layer (for example, black matrix (BM)) may be provided on the substrate 111.

The substrate 111 may be formed of various materials. For example, the substrate 111 may be formed of a transparent glass material containing SiO2 as a main component.

That is, the LED module according to an embodiment may be formed as a Chip On Glass (COG) type. In addition, the LED module according to another embodiment may be formed as a Chip On Film (COF) type.

However, the substrate 111 is not limited thereto. Therefore, the substrate 111 may be formed of transparent plastic material and thus the substrate 111 may have flexibility. The plastic material may be an insulating organic material selected from a group consisting of polyethersulphone (PES), polyacrylate (PAR), polyetherimide (PEI), polyethylenenaphthalate (PEN), polyethylene terephthalate (PET), polyphenylene sulfide (PPS), polyallylate, polyimide, polycarbonate (PC), cellulose triacetate (TAC), and cellulose acetate propionate (CAP).

According to an embodiment of the present disclosure, the LED module 110 may be a bottom emission type, and the substrate 111 may be formed of a transparent material.

The substrate 111 may include a light emitting region in which the LED 380 is disposed to emit light, and a non-light emitting region in which a circuit element such as a thin-film transistor (TFT) 200 is disposed and light is not emitted. The light absorbing layer (for example, black matrix (BM)) for improving visibility by absorbing external light may be provided on the non-light emitting region of the substrate 111.

The above-described LED may be provided as an inorganic light emitting diode.

Particularly, the LED 380 is a LED of 10-100 μm size, and the LED 380 is formed in such a way that a thin film growth method is performed with inorganic materials such as Al, Ga, N, P, As and In, on a sapphire substrate or a silicon substrate and then the sapphire substrate or the silicon substrate is cut out and separated.

The light absorbing layer may include a black inorganic material, a black organic material, or a black metal that absorbs light well.

For example, a light absorbing material may include carbon black, polyene-based pigments, azo-based pigments, azomethine-based pigments, diimmonium-based pigments, phthalocyanine-based pigments, quinone-based pigments, indigo-based pigments, thioindigo-based pigments, dioxadin-based pigments, quinacridone-based pigments, isoindolinone-based pigments, metal oxides, metal complexes, and other materials such as aromatic hydrocarbons.

As illustrated in FIG. 5, a buffer layer 113 may be formed on the substrate 111. The buffer layer 113 may provide a flat surface on a top of the substrate 111 and may prevent foreign materials or moisture from penetrating through the substrate 111. For example, the buffer layer 113 may be formed of an inorganic material such as silicon oxide, silicon nitride, silicon oxynitride, aluminum oxide, aluminum nitride, titanium oxide or titanium nitride, or an organic material such as polyimide, polyester, or acrylic. Alternatively, the buffer layer 113 may be formed by a plurality of laminated layers of the above-mentioned materials.

Referring to FIG. 5, the LED module according to an embodiment may include a signal wiring layer.

The signal wiring layer (SL) may correspond to a TFT substrate, and the TFT and various wirings for driving the LED 380 may be provided in the pixel region P of an upper surface of the signal wiring layer (SL).

In response to the TFT being turned on, a drive signal input from the outside through the wiring may be applied to the LED 380 and thus the LED 380 may emit light so as to display an image.

The signal wiring layer (SL) to which the gate electrode, the data electrode, and the LED are connected may be provided on a first insulating layer 117 and a second insulating layer 118.

A test pad (TP) according to the present disclosure may be connected to the above-described signal wiring layer (SL) through a test wiring.

The test wiring may be provided in a structure including a wiring protection layer in addition to the wiring itself.

The signal wiring layer (SL) may include a plurality of electrodes connected by a passive matrix circuit.

That is, the signal wiring layer (SL) may be driven by the PM circuit and may include the plurality of electrodes connected to a corresponding circuit.

A user may detect an error of the LED based on the test pad (TP) provided as described above.

In addition, the signal wiring layer (SL) of the LED module 110 according to an embodiment may include a boundary region 280 corresponding to a predetermined point.

The boundary region 280 may correspond to a mark for forming each unit region, as will be described later. That is, each unit region may be formed through electrical opening, and in manufacturing the LED, a point to be electrically opened may be displayed through the boundary region.

According to an embodiment, the boundary region 280 may be provided as a bridge-type wiring structure included in the signal wiring layer (SL).

Referring to FIG. 6, the TFT 200 and the LED 380 may be provided on the buffer layer 113.

The TFT 200 may include a semiconductor active layer, a gate electrode, a source electrode, and a drain electrode. The semiconductor active layer may include a semiconductor material, and the semiconductor active layer may include a source region, a drain region, and a channel region between the source region and the drain region. The gate electrode may be formed on the active layer to correspond to the channel region. The source electrode and the drain electrode may be electrically connected to the source region and the drain region of the active layer, respectively.

A gate insulating layer may be disposed between the active layer and the gate electrode. The gate insulating layer may be formed of an inorganic insulating material.

An interlayer insulating layer 115 may be disposed between the gate electrode and the source electrode and between the gate electrode and the drain electrode. The interlayer insulating layer 115 may be formed of an organic insulating material or an inorganic insulating material. Alternatively, the interlayer insulating layer 115 may be formed by alternating the organic insulating material and the inorganic insulating material. The first insulating layer 117 may be arranged as a planarization film on the source electrode and the drain electrode. The first insulating layer 117 may be formed of an organic insulating material or an inorganic insulating material. Alternatively, the first insulating layer 117 may be formed by alternating the organic insulating material and the inorganic insulating material.

According to an embodiment of the present disclosure, the TFT 200 is implemented in a top gate type in which a gate electrode is disposed on top of the semiconductor active layer, but is not limited thereto. Therefore, the gate electrode may be disposed below the semiconductor active layer.

As illustrated in FIG. 6, the LED 380 may be disposed on the first insulating layer 117. According to an embodiment of the present disclosure, the LED 380 may be a micro-LED. Micro may indicate a size of 1 to 100 µm, but is not limited thereto. Therefore, the LED 380 may employ a LED that is greater or less than the size of 1 to 100 µm.

The micro-LED may be individually or multiply picked up from a wafer by a transfer mechanism and transferred to the substrate 111. Because the micro-LED is formed of an inorganic material, the micro-LED may have a faster reaction rate, a lower power consumption, and higher luminance than an organic light emitting diode (OLED) using an organic material. In addition, the OLED is vulnerable to exposure to moisture and oxygen, and thus has poor durability. Accordingly, the OLED requires an encapsulation process. Therefore, the micro-LED does not require an encapsulation process and has superior durability.

The LED 380 may emit light of a predetermined wavelength within a wavelength range from ultraviolet light to visible light. For example, the LED 380 may be a red, green, blue, white LED or UV LED. That is, a red LED, a green LED, and a blue LED are respectively disposed in the adjacent sub-pixel regions SP, and the three adjacent sub-pixel regions SP may form one pixel region P. A single color may be determined by mixing red light, green light, and blue light generated in one pixel region P.

The LED 380 may include a p-n diode, the anode 310 and the cathode 320. The anode 310 and/or the cathode 320 may be formed of a variety of conductive materials, including metals, conductive oxides and conductive polymers. The anode 310 may be electrically connected to a signal electrode 510, and the cathode 320 may be electrically connected to a common electrode 530. The p-n diode may include a p-doped portion in the anode 310 side, one or more quantum well portion and a n-doped portion in the cathode 320 side. Alternatively, the p-n diode may include a p-doped portion in the cathode 320 side, one or more quantum well portion, and a n-doped portion in the anode 310 side.

The anode 310 and the cathode 320 may be disposed on the upper surface of the LED 380. Conversely, a light emitting surface of the LED 380 may be disposed on a lower surface of the LED 380. Accordingly, the light emitting surface of the LED 380 may be in contact with the first insulating layer 117, and the LED 380 may emit light toward the substrate 111.

The gate electrode and the data electrode may be disposed on the first insulating layer 117. The wiring structure in which the gate electrode, the data electrode, and the light-emitting diode are connected may be disposed on the first insulating layer 117 and the second insulating layer 118.

That is, according to an embodiment of the present disclosure, the LED 380 may be a bottom emission type. Because the LED 380 is a bottom emission type, a pixel circuit element such as the TFT 200 and the LED 380 are disposed so as not to overlap each other in a vertical direction. The LED 380 may be fixed on the first insulating layer 117 by an adhesive coating.

As shown in FIG. 6, the second insulating layer 118 may be disposed on the first insulating layer 117 to surround the LED 380. The second insulating layer 118 may include an organic insulating material. For example, the second insulating layer 118 may be formed of acrylic, polymethyl methacrylate (PMMA), benzocyclobutene (BCB), polyimide, acrylate, epoxy, and polyester, but is not limited thereto.

An upper electrode 240s may connect the driver ICs 900 configured to drive the LED module 110 to the pixel circuit.

For example, the upper electrode 240s may be disposed in connection with the power voltage electrode 240, the data signal electrode, the gate electrode, and the reference voltage VSS.

The upper electrode 240s may include a signal electrode configured to connect the drain electrode of the TFT 200 to the anode of the LED 380 to apply the data signal to the LED 380, and a common ground electrode configured to connect the cathode of the LED 380 to the reference voltage VSS to provide a ground to the LED 380.

Because the LED 380 is a bottom emission type, the first insulating layer 117, the interlayer insulating layer 115, the gate insulating layer 114, and the buffer layer 113 may be formed of a transparent material.

Although FIG. 6 illustrates that the second insulating layer is disposed after the LED is transferred, the LED may be transferred after the second insulating layer is disposed. That is, in preparing the second insulator and the LED on the substrate, a sequence thereof may vary, and a wiring shape may also vary according to the sequence.

In addition, the LED 380 may be provided to be connected to the signal wiring layer (SL).

The signal wiring layer corresponding to the above-described boundary region 280-1 may be electrically open.

Further, a photo/etch process and a laser may be used for the electrically opening.

In the case of the photo/etch process, after the second insulating layer 118 is removed, the boundary region 280-1 may be removed in the electrical opening.

However, based on a laser used for opening, the electrical opening may be performed only by removing the boundary region 280-1. The electrically opened-boundary region 280-1 may correspond to a boundary between the unit regions 111*a* and 112*a*.

That is, the unit regions 111*a* and 112*a* may be divided based on the boundary region 280-1. Each unit region may be electrically operated independently.

Further, according to another embodiment, the unit region may be formed by removing the first insulating layer 117 and by removing the electrode included in the first insulating layer.

A user may determine whether an error occurs in the LED module based on the light emission of the LED corresponding to a test current obtained from the test pad TP after the LED is mounted.

Particularly, in response to a current being applied to the light-emitting diode module, each LED 380 may operate. On the other hand, in response to a defect being generated in the LED module, the LED 380 may not emit light.

A user may determine that an error occurs in the LED module.

In this case, after the LED is transferred and the signal wiring layer (SL) is prepared, a lighting test may be performed through an inspection machine.

Thereafter, the defective pixel of the LED may be repaired.

Referring to FIG. 7, the above-described upper electrode may be provided on an upper insulating layer 119, and a fan-out wiring Vss-F connected to the upper electrode may be further included.

In the LED module, a portion in which the LED is mounted to emit light may be defined as an active area (AA).

The AA may represent a region including a wiring layer required for driving the diode device, in addition to the diode device.

The LED module may include a non-active area (NAA) that is a region other than the active area (AA).

The non-active area (NAA) may refer to a region excluding the AA provided in the LED.

The test pad (TP) according to an embodiment may be provided in the non-active area (NAA) of the LED module.

Further, the method of manufacturing the LED according to an embodiment may include a process of cutting the non-active area (NAA).

The upper insulating layer 119 may be provided to protect the LED while allowing a wiring structure connected to the diode and the fan-out wiring Vss-F to be a different layer structure.

In addition, a via hole corresponding to each upper electrode may be provided in the upper insulating layer 119 to provide the fan-out wiring.

A third insulating layer 120 may be provided on the upper insulating layer 119 so as be connected to a film on glass (FOG) electrode 800 through the fan-out wiring and a capping metal 400. According to an embodiment, the capping metal may be formed of Indium Tin Oxide (ITO).

The FOG electrode 800 is formed for each unit region 111 and 112 as described later, and the FOG electrode may be connected to the driver IC.

The capping metal 400 may be connected to the FOG electrode 800 through an Anisotropic Conductive Film (ACF) bonding 600.

The ACF may refer to an anisotropic conductive film.

Various driver IC chips, for driving the LED module 110, such as a power line, a data IC, a gate IC, a touch sensor IC, a wireless controller, and a communication IC may be connected to the FOG electrode 800.

The FOG electrode 800 may be electrically connected to the fan-out wiring Vss-F by the ACF bonding 600.

According to the above structure, the driver IC 900 may be disposed on the rear side of the light emitting surface of the substrate 111.

At least one light absorbing layer (for example, black matrix) is provided in the layers described with reference to FIGS. 5 to 7 for pixel-to-pixel separation, thereby improving the uniformity of screen output and color separation.

In addition, a user can produce the LED module by the above-described method, and after the production of the LED module is completed, a substrate S7 including the above-described test pad (TP) may be cut (C7).

Particularly, in cutting the substrate S7, an unnecessary part of the product may be cut by wheel cutting or laser cutting. The cut part may further include the test pad (TP) and dummy pads, and by cutting a part of the substrate, it is possible to implement a bezel-less display.

The embodiment described with reference to FIGS. 5 to 8 is only an embodiment of the present disclosure. Alternatively, the form in which the LED module is implemented may be a flip chip and a vertical chip, and there is no limitation in the form in which the LED is implemented.

Figure 8:
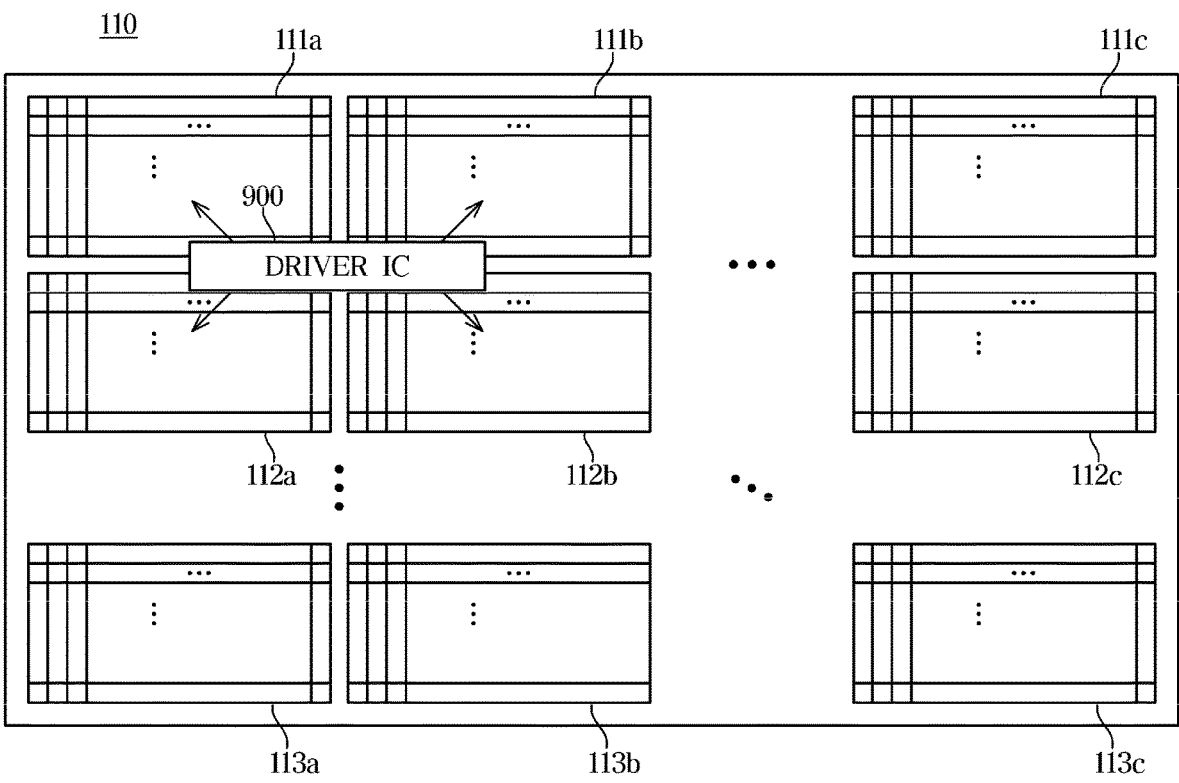
FIG. 8 is a view illustrating control of a plurality of unit regions according to an embodiment of the present disclosure.

FIG. 8 is a view illustrating control of the unit regions according to an embodiment of the present disclosure.

Referring to FIG. 8, each of the unit regions 111*a*, 111*b*, 112*a*, and 112*b* of the LED module may be connected to the driver IC 900.

The LED module of the present disclosure may be driven by the PM method, thereby outputting a high pixel.

According to an embodiment, the LED module may be provided to output full-high definition (FHD) of 1,920×1, 080 pixels or more pixels such as quad-high definition (QHD) of 2560×1440 pixels and ultra-high definition (UHD) of 3840×2160 pixels.

That is, after dividing the driving part into several unit regions based on the above-described operation, the LED module 110 may apply the PM driving to each block.

The plurality of unit regions 111*a*, 111*b*, 112*a*, and 112*b* divided by the electrical opening may be connected to the driver IC 900.

The plurality of unit regions 111*a*, 111*b*, 112*a*, and 112*b* may be connected to the (single) driver IC 900. That is, a plurality of unit regions may be driven by a single driver IC.

With configuration, it is possible to reduce the number of driver ICs required for driving. In addition, the signal transmission is possible by forming a fan-out wiring extending from the driver IC to each unit region.

FIG. 8 illustrates a configuration in which four-unit regions 111*a*, 111*b*, 112*a*, and 112*b* are controlled by the (single) driver IC 900. That is, a single driver IC may transmit a signal to four-unit regions. As will be described later, the driver IC may be connected to at least one processor provided in the display apparatus so as to control each unit region.

Figure 9:
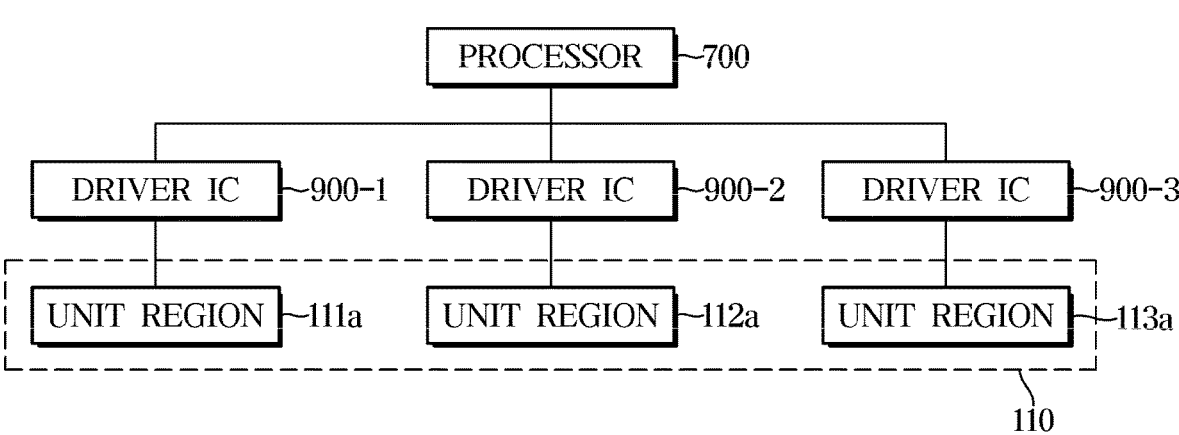
FIG. 9 is a view illustrating an operation of the display apparatus according to an embodiment of the present disclosure.

FIG. 9 is a view illustrating an operation of the display apparatus according to an embodiment of the present disclosure.

Referring to FIG. 9, the display apparatus 1 according to an embodiment may include at least one processor 700, driver ICs 900-1, 900-2, and 900-3, and the LED module 110. The LED module 110 may include the plurality of unit regions 111*a*, 112*a*, and 113*a* as described above.

Particularly, in the display apparatus 1 according to an embodiment may divide the LED module 110 into the plurality of unit regions 111*a*, 112*a*, and 113*a*.

Each of the unit regions 111*a*, 112*a*, and 113*a* may be divided by the electrically opening process.

That is, the LED module 110 may include the plurality of unit regions 111*a*, 112*a*, and 113*a* provided with a boundary at a predetermined point.

The LED module 110 may further includes the FOG electrode and may be connected to the driver ICs 900-1, 900-2, and 900-3 through the FOG electrode.

The driver ICs 900-1, 900-2, and 900-3 may be connected to the unit regions 111*a*, 112*a*, and 113*a* provided in the LED module 110 in a one-to-one correspondence, and a single driver IC may be connected to a plurality of unit regions.

The at least one processor 700 may be connected to the driver ICs 900-1, 900-2, and 900-3 to control the plurality of unit regions 111, 112 and 113.

The at least one processor 700 may be provided as a timing controller (T-con).

In addition, the at least one processor 700 may control the LED module through the PM method.

That is, the driver IC connected to each unit region may be connected to the at least one processor 700.

Further, the at least one processor 700 may transmit a signal to each unit region through each driver IC.

Particularly, based on the LED module 110 being provided as a large substrate, a wiring layer and a light-emitting diode may be formed on a single large substrate.

In addition, each of the unit regions 111*a*, 112*a*, and 113*a* may be formed by electrically opening the LED module.

Based on the above-mentioned configuration, the at least one processor 700 may output a high-resolution screen by controlling the sync of each unit region through the PM driving method.

Figure 10:
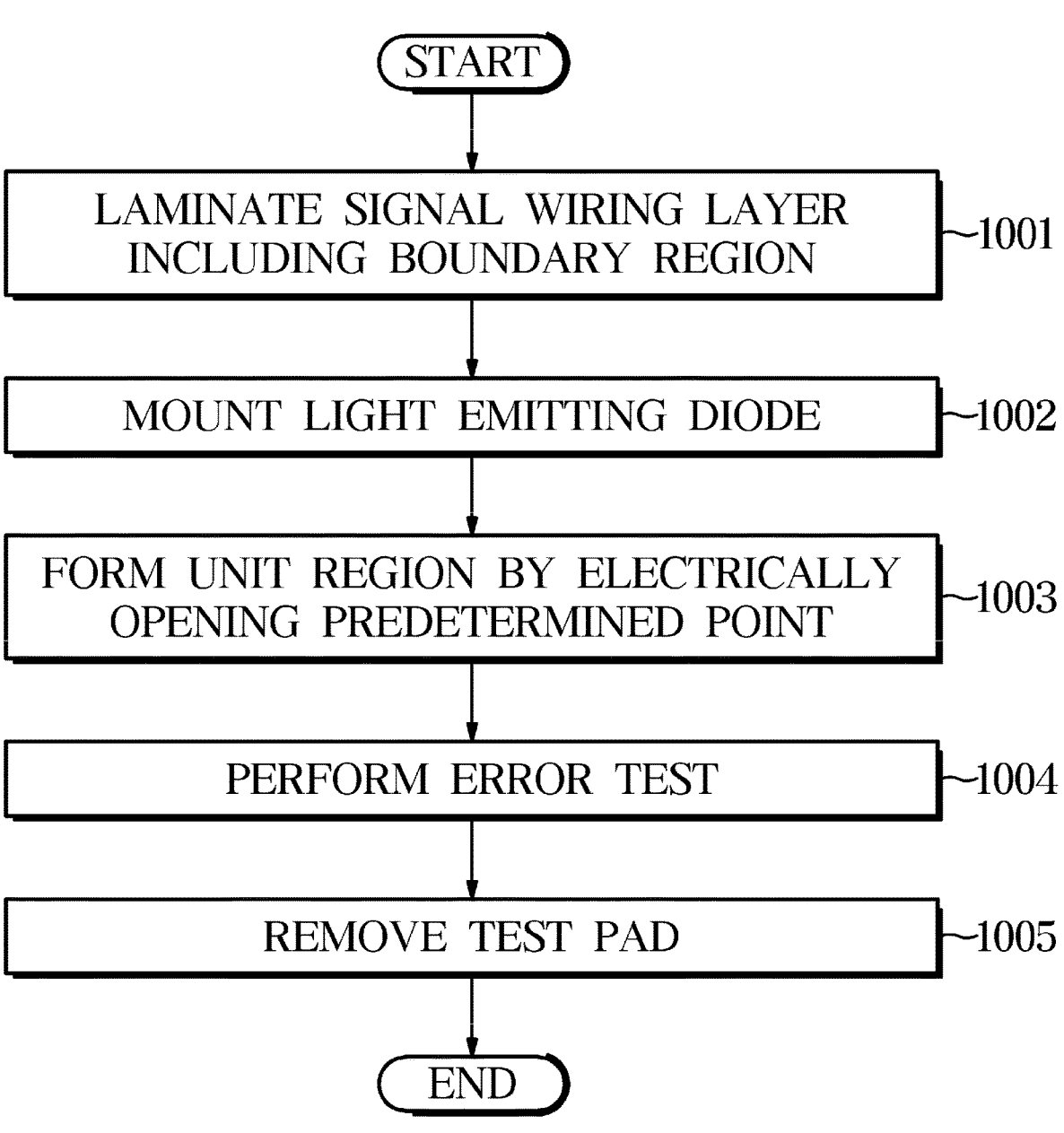
FIG. 10 is a flowchart illustrating the method of manufacturing an LED according to an embodiment of the present disclosure.

FIG. 10 is a flowchart illustrating the method of manufacturing the light-emitting diode according to an embodiment of the present disclosure.

Referring to FIG. 10, a user may laminate the signal wiring layer including the boundary region (1001). As described above, the boundary region may be provided as a bridge-type wiring structure.

Thereafter, the LED may be mounted on the signal wiring layer (1002).

After the LED is mounted, a unit region may be formed by electrically opening a corresponding boundary region, that is, a predetermined point (1003). The photo/etch and laser methods may be used for the electrically opening as described above.

In addition, an error occurrence test of each unit region and signal wiring of each LED module may be performed through the test pad provided in the LED module (1004).

In response to the completion of the test, the dummy part including the test pad may be removed (1005).

The disclosed embodiments may be embodied in the form of a recording medium storing instructions executable by a computer. The instructions may be stored in the form of program code and, when executed by a processor, may generate a program module to perform the operations of the disclosed embodiments. The recording medium may be embodied as a computer-readable recording medium.

The computer-readable recording medium includes all kinds of recording media in which instructions which can be decoded by a computer are stored. For example, there may be a Read Only Memory (ROM), a Random Access Memory (RAM), a magnetic tape, a magnetic disk, a flash memory, and an optical data storage device.

While embodiments of the present disclosure has been particularly described, it should be understood by those of skilled in the art that various changes in form and details may be made without departing from the spirit and scope of the present disclosure.

What is claimed is:

1. A light-emitting diode (LED) module comprising:
a glass substrate;
a signal wiring layer provided on the glass substrate and comprising a plurality of electrodes connected by a passive matrix circuit; and
a plurality of LEDs connected to the plurality of electrodes and configured to emit light toward the glass substrate,
wherein the signal wiring layer further comprises a boundary region that divides the LED module into a plurality of unit regions,
wherein the signal wiring layer comprises a plurality of electrically opened areas in the boundary region,
wherein the plurality of unit regions are respectively formed by the plurality of electrically opened areas,
wherein the boundary region comprises a lower surface and at least two side surfaces,
wherein the lower surface of the boundary region corresponds to a portion of a upper surface of the signal wiring layer,
wherein a length of a top opening of the boundary region is longer than a length of the lower surface of the boundary region, and
wherein the boundary region is filled with a first insulating layer.

2. The LED module of claim 1 further comprising an active area and a non-active area excluding the active area, wherein the plurality of LEDs is provided in the active area.

3. The LED module of claim 2 further comprising a test pad provided in the non-active area.

4. The LED module of claim 1, further comprising a second insulating layer on the glass substrate; and
a film on glass (FOG) electrode corresponding to the plurality of unit regions and provided on the second insulating layer.

5. A display apparatus comprising:
a light-emitting diode (LED) module comprising a plurality of layer structures;
at least one processor configured to control the LED module; and
a plurality of driver Integrated Circuits (ICs) connected to the at least one processor to transmit a signal to the LED module,
wherein the LED module comprises:
a glass substrate;
a signal wiring layer formed on the glass substrate and comprising a plurality of electrodes connected by a passive matrix circuit; and
a plurality of LEDs connected to the plurality of electrodes and configured to emit light toward the glass substrate, wherein the signal wiring layer comprises a boundary region that divides the LED module into a plurality of unit regions, wherein the signal wiring layer comprises a plurality of electrically opened areas in the boundary region, wherein the plurality of unit regions are respectively formed by the plurality of electrically opened areas, wherein the boundary region comprises a lower surface and at least two side surfaces, wherein the lower surface of the boundary region corresponds to a portion of a upper surface of the signal wiring layer, wherein a length of a top opening of the boundary region is longer than a length of the lower surface of the boundary region, and wherein the boundary region is filled with a first insulating layer.

6. The display apparatus of claim 5, wherein at least one driver IC of the plurality of driver ICs is configured to transmit a driving signal to the plurality of unit regions of the LED module.

7. The display apparatus of claim 5, wherein the LED module comprises an active area and a non-active area excluding the active area, and wherein the plurality of LEDs is provided in the active area.

8. The display apparatus of claim 7, further comprising a test pad provided in the non-active area.

9. The display apparatus of claim 5, further comprising:

a second insulating layer on the glass substrate; and a film on glass (FOG) electrode corresponding to the plurality of unit regions and the FOG electrode being provided on the second insulating layer.

10. The display apparatus of claim 9, wherein at least one of the plurality of driver ICs is configured to connect the at least one processor and the FOG electrode.

11. The display apparatus of claim 10, wherein the at least one processor is further configured to control the LED module corresponding to the plurality of unit regions.

* * * * *